United States Patent
Gurrieri et al.

(10) Patent No.: US 9,018,972 B1
(45) Date of Patent: Apr. 28, 2015

(54) AREA-EFFICIENT PHYSICALLY UNCLONABLE FUNCTION CIRCUIT ARCHITECTURE

(71) Applicant: Sandia Corporation, Albuquerque, NM (US)

(72) Inventors: Thomas Gurrieri, Albuquerque, NM (US); Jason Hamlet, Albuquerque, NM (US); Todd Bauer, Albuquerque, NM (US); Ryan Helinski, Albuquerque, NM (US); Lyndon G. Pierson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 160 days.

(21) Appl. No.: 13/906,628

(22) Filed: May 31, 2013

Related U.S. Application Data

(60) Provisional application No. 61/655,070, filed on Jun. 4, 2012.

(51) Int. Cl.
 *H03K 19/00* (2006.01)
 *H03K 19/003* (2006.01)
(52) U.S. Cl.
 CPC .................................... *H03K 19/003* (2013.01)
(58) Field of Classification Search
 CPC ........................... G06F 21/76; H03K 19/17768
 USPC .............................................................. 326/8
 See application file for complete search history.

(56) References Cited

U.S. PATENT DOCUMENTS

| | | | |
|---|---|---|---|
| 6,472,927 B1 | 10/2002 | Desroches | |
| 7,370,190 B2 | 5/2008 | Calhoon et al. | |
| 7,411,436 B2 | 8/2008 | Fang et al. | |
| 7,564,345 B2 | 7/2009 | Devadas et al. | |
| 7,653,197 B2 | 1/2010 | Van Dijk | |
| 7,681,103 B2 | 3/2010 | Devadas et al. | |
| 7,702,927 B2 | 4/2010 | Devadas et al. | |
| 7,757,083 B2 | 7/2010 | Devadas et al. | |
| 7,818,569 B2 | 10/2010 | Devadas et al. | |
| 7,839,278 B2 | 11/2010 | Devadas et al. | |
| 7,840,803 B2 | 11/2010 | Clarke et al. | |
| 7,919,994 B2 | 4/2011 | Walker et al. | |
| 8,032,760 B2 | 10/2011 | Tuyls et al. | |

(Continued)

OTHER PUBLICATIONS

Su, Ying et al., "A Digital 1.6 pJ/bit Chip Identification Circuit Using Process Variations," IEEE Journal of Solid-State Circuits, vol. 43, No. 1, Jan. 2008, pp. 69-77.

(Continued)

*Primary Examiner* — Jason M Crawford
(74) *Attorney, Agent, or Firm* — Blakely, Sokoloff, Taylor & Zafman, LLP

(57) ABSTRACT

Generating a physically a physically unclonable function ("PUF") circuit value includes comparing each of first identification components in a first bank to each of second identification components in a second bank. A given first identification component in the first bank is not compared to another first identification component in the first bank and a given second identification component in the second bank is not compared to another second identification component in the second bank. A digital bit value is generated for each comparison made while comparing each of the first identification components to each of the second identification components. A PUF circuit value is generated from the digital bit values from each comparison made.

17 Claims, 9 Drawing Sheets

(56) References Cited

U.S. PATENT DOCUMENTS

| | | | |
|---|---|---|---|
| 8,516,269 B1* | 8/2013 | Hamlet et al. | 713/189 |
| 8,619,979 B2 | 12/2013 | Ficke et al. | |
| 8,782,396 B2 | 7/2014 | Ziola et al. | |
| 8,848,905 B1 | 9/2014 | Hamlet et al. | |
| 2007/0038871 A1 | 2/2007 | Kahlman et al. | |
| 2007/0183194 A1 | 8/2007 | Devadas et al. | |
| 2008/0059809 A1 | 3/2008 | Van Dijk | |
| 2009/0083833 A1* | 3/2009 | Ziola et al. | 726/2 |
| 2010/0085075 A1* | 4/2010 | Luzzi et al. | 326/8 |
| 2011/0317829 A1* | 12/2011 | Ficke et al. | 380/46 |
| 2013/0082733 A1* | 4/2013 | Shimizu | 326/8 |

OTHER PUBLICATIONS

Lee, Jae W. et al., "A Technique to Build a Secret Key in Integrated Circuits for Identification and Authentication Applications," Computation Structures Group Memo 472, CSAIL Computer Science and Artificial Intelligence Laboratory, Massachusetts Institute of Technology, 2004, 6 pages.

Kaps, Jens-Peter et al., "Energy Scalable Universal Hashing," IEEE Transactions on Computers, vol. 54, No. 12, Dec. 2005, pp. 1484-1495.

Kumar, Sandeep S. et al., "Extended Abstract: The Butterfly PUF Protecting IP on every FPGA," Proceedings of the 2008 IEEE International Workshop on Hardware-Oriented Security and Trust, 2008, 4 pages.

Guajardo, Jorge et al., "FPGA Intrinsic PUFs and Their Use for IP Protection," Proceedings of the 9th international workshop on Cryptographic Hardware and Embedded Systems, Lecture Notes in Computer Science; vol. 4727, 2007, pp. 63-80.

Dodis, Yevgeniy et al., "Fuzzy Extractors: How to Generate Strong Keys from Biometrics and Other Noisy Data," SIAM Journal on Computing, vol. 38, Issue 1, 2008, 18 pages.

Maes, Roel et al., "Intrinsic PUFs from Flip-flops on Reconfigurable Devices," 3rd Benelux Workshop on Information and System Security, 2008, 17 pages.

Krawczyk, Hugo, "LFSR-based Hashing and Authentication," Advances in Cryptology—CRYPTO '94, Lecture Notes in Computer Science, vol. 839, 1994, pp. 129-139.

Suh, Edward G. et al., "Physical Unclonable Functions for Device Authentication and Secret Key Generation," Proceedings of the 44th annual Design Automation Conference, 2007, pp. 9-14.

Guajardo, Jorge et al., "Physical Unclonable Functions and Public-Key Crypto for FPGA IP Protection," Philips Research Laboratories, Eindhoven, The Netherlands, 2007, 7 pages.

Gassend, Blaise et al., "Silicon Physical Random Functions," Computation Structures Group Memo 456, In the proceedings of the Computer and Communication Security Conference, Nov. 2002, Massachusetts Institute of Technology, Computer Science and Artificial Intelligence Laboratory, 15 pages.

Helinski, Ryan, et al. "A Physical Unclonable Function Defined using Power Distribution System Equivalent Resistance Variations," in Design Automation Conference, 2009 DAC '09. 46th ACM/IEEE, Jul. 2009, pp. 676-681.

Lofstrom, Keith, et al. "IC Identification Circuit using Device Mismatch," 2000 IEEE International Sold-State Circuits Conference, Digest of Technical Papers, (ISSCC) 2000, pp. 372-373.

Su, Y. et al., "A 1.6pj/bit 96% Stable Chip-ID Generating Circuit using Process Variations," 2007 IEEE International Sold-State Circuits Conference, ISSCC 2007/ Session 22/ Digital Circuit Innovations/ 22.5, pp. 406-407.

Helinski, Ryan. et al., "Quality Metric Evaluation of a Physical Unclonable Function Derived from an IC's Power Distribution System," In Proceedings of the 47th Design Automation Conference, 2010, pp. 240-243.

Maeda, Shigenobu, et al., "An Artificial Fingerprint Device (AFD): A Study of Identification Number Applications Utilizing Characteristics Variation of Polycrystalline Silicon TFTs," IEEE Transactions on Electron Devices, vol. 50, No. 6, Jun. 2003, pp. 1451-1458.

Roy, Deepu, et al., "Comb Capacitor Structures for On-Chip Physical Uncloneable Function," IEEE Transactions on Semiconductor Manufacturing, vol. 22, No. 1, Feb. 2009, pp. 96-102.

"LISA: Maximizing RO PUF's Secret Extraction," 2010 IEEE International Symposium on Hardware-Oriented Security and Trust (HOST), pp. 100-105. 978-1-4224-7812-5/10.

Gurrieri, Thomas et al., U.S. Appl. No. 13/906,660, filed May 31, 2013.

* cited by examiner

AREA-EFFICIENT PHYSICALLY UNCLONABLE FUNCTION CIRCUIT ARCHITECTURE

CROSS REFERENCE TO RELATED APPLICATIONS

This application claims priority under the provisions of 35 U.S.C. §119(e) to U.S. Provisional Application No. 61/655,070 filed on Jun. 4, 2012.

The present application is related to a U.S. Application entitled "Voltage Dividing Physically Unclonable Function Circuit Architecture," filed on the same day.

STATEMENT REGARDING FEDERALLY SPONSORED RESEARCH

This invention was developed with Government support under Contract No. DE-AC04-94AL85000 between Sandia Corporation and the U.S. Department of Energy. The U.S. Government has certain rights in this invention.

TECHNICAL FIELD

This disclosure relates generally to trusted computing, and in particular but not exclusively, relates to hardware authentication to protect against subversion by substitution.

BACKGROUND INFORMATION

Trustworthy computing (with software) cannot exist without trustworthy hardware to build it on. Even if an integrated circuit is produced using rigorous procedures in a "Trusted Foundry" and certified as "trustworthy," technology must be developed to ensure against wholesale replacement of the component with a separately manufactured but subverted "look-alike" after the point of certification. Without detection of subversion by wholesale component substitution, today's information processing systems are vulnerable to sophisticated adversaries that can fabricate "look-alike" components that perform the same function as the intended component but which may contain additional subversion artifices that can be later triggered by an adversary to disrupt or compromise operation.

Using physical system protection schemes to prevent subversive attacks in deployed information processing hardware is technically difficult and expensive. An alternative to resisting subversive attack with physical system protection schemes is to employ robustly authenticated and protected hardware architectures to enable tracing of the origin of these components. Physically Unclonable Function (PUF) technology may be leveraged to deter adversaries from attempting subversion by insertion of subversive functionality and also by instantiation of counterfeit components (subversion via substitution). PUFs are derived from the inherently random, physical characteristics of the material, component, or system from which they are sourced, which makes the output of a PUF physically or computationally very difficult to predict. Silicon-based microelectronics appear to be a potentially rich source of PUFs because subtle variations in the production processes result in subtle variations in the physical and operational properties of the fabricated devices. Additionally, each device can have millions of exploitable transistors, circuits, and other active and passive components. Accordingly, PUFs extracted from microelectronics are of keen interest because of their potential applications to cyber security.

Trusted foundry processing of silicon-based microelectronics requires enormous investments to protect against subversion; however, this investment imparts trust only during the fabrication phase of a component's life cycle. Without the equivalent of rigorous two-person control of the component during the deployment phase of its life cycle, it can be difficult to demonstrate authenticity even for components from today's trusted foundries.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Figure 1:
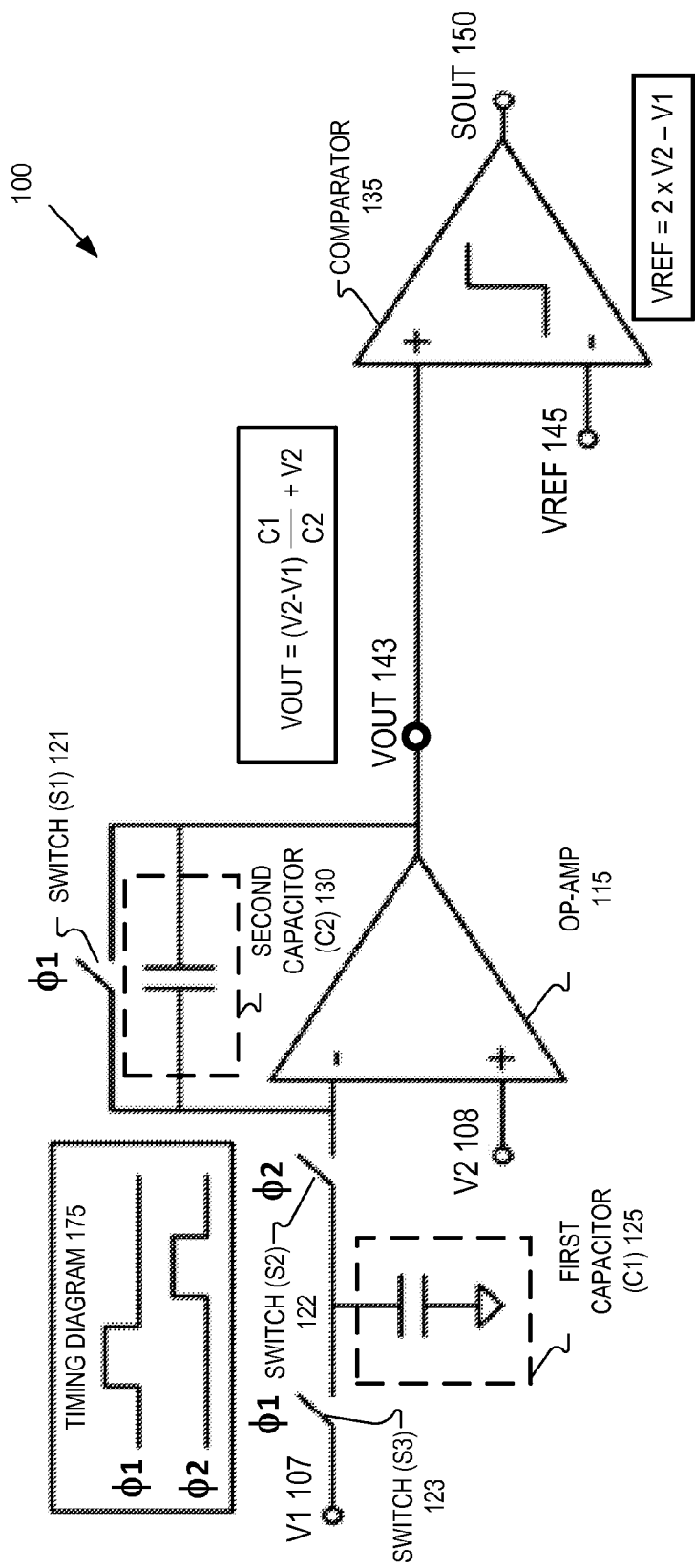
FIG. 1 illustrates an example of a physically unclonable function ("PUF") circuit including a first capacitor and a second capacitor, in accordance with an embodiment of the disclosure.

Embodiments of a system and method for generating physically unclonable function ("PUF") circuit values are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Disclosed embodiments leverage Physical Unclonable Function (PUF) technology for creation of a device fingerprint in an area-efficient configuration. PUFs are derived from random physical characteristics within the hardware of a device, which makes a PUF output difficult to predict from one device to another. The random PUF output can subsequently be used to generate the device fingerprint which can be authenticated at any time during the deployment phase of a component life cycle using a cryptographic challenge/response protocol.

PUFs are functions that are derived from the inherently random, physical characteristics of the material or device in which they are built. For example, many electronic devices (e.g. integrated circuits) are manufactured using semiconductors such as silicon. Electronic components (e.g. transistors, resistors, and capacitors) are designed into many silicon-based electronic devices. A PUF may exploit slight manufacturing physical variations in electronic components. For example, the slight variations may cause electrical components that were designed to be identical to have slightly different values. Since the PUF exploits physical variations of the device or material in which it is built, each PUF could provide a unique (although perhaps noisy) response. This property should hold even amongst "identical" devices fabricated with the same process. Moreover, it should be difficult to purposefully produce a PUF with the same output as a given PUF. The quality of a PUF can be measured by inter-device variation and intradevice variation. Ideally, the inter-device variation of a PUF should be 50% so different devices produce very different output, while the intradevice variation should be 0% so that a given device consistently provides the same response. In practice, interdevice and intradevice variations will be less than the ideal goals. Additionally, a good PUF should be resistant to changes in temperature, supply voltage, and other environmental conditions.

FIG. 1 illustrates an example of a physically unclonable function ("PUF") circuit 100, in accordance with an embodiment of the disclosure. PUF circuit 100 includes first capacitor (C1) 125, second capacitor (C2) 130, operational-amplifier 115, and comparator 135. C1 125 and C2 130 are coupled to operational-amplifier 115 to form an integrating circuit. C1 125 is coupled to a first input of the integrating circuit and C2 130 is coupled to a second input of the integrating circuit. In the illustrated embodiment, C2 130 is coupled to an inverting input and an integrating output (VOUT 143) of operational-amplifier 115. Voltage (V2) 108 is coupled to the non-inverting input of operational-amplifier 115. A first switch 121 is coupled between the inverting input and the integrating output of operational-amplifier 115, in parallel with C2 130. A second switch is coupled between the first input (where C1 125 is coupled to the integrating circuit) and the inverting input of operational-amplifier 115. Still referring to the illustrated embodiment, a third switch 123 is coupled between a voltage input (V1) 107 and the first input of the integrating circuit.

First switch 121 and third switch 123 are coupled to receive a same first activation signal ($\phi1$) and first switch 121 and third switch 123 close in response to the first activation signal ($\phi1$). Second switch 122 is coupled to close when receiving a second activation signal ($\phi2$) different than the first activation signal $\phi1$. The switches may be implemented with transistors.

Timing diagram 175 shows that $\phi1$ is activated first, followed by activation of $\phi2$. When $\phi1$ is activated, it unbalances the charge on C1 125 and C2 130. The charge on C1 125 is V1 107 multiplied by the capacitance value of C1 125. The charge on C2 130 is zero because when $\phi1$ is activated, first switch 121 shorts C2 130. When $\phi2$ follows $\phi1$, the integration circuit rebalances the charge on C1 125 and C2 130. The final value of VOUT 143 that is required to rebalance the charge on each capacitor depends on the ratio of C1 125 to C2 130. VOUT 143 is given by:

$$[(V2-V1)*(C1/C2)]+V2.$$

VOUT 143 reflects the difference between C1 and C2.

The integrating output of operational-amplifier 115 is coupled to comparator 135. Comparator 135 is coupled to output a digital bit value in response to comparing a reference voltage (VREF) 145 to VOUT 143. In the illustrated embodiment, VREF 145=2*V2−V1. If C1 is greater than C2, SOUT 150 goes HIGH. If C1 is less than C2, SOUT 150 goes LOW.

In one embodiment, C1 125 and C2 130 may be designed to be seemingly identical (e.g. 28 pF). However, manufacturing variations will give the seemingly identical C1 and C2 slightly different values. Consequently, it is hard to predict what digital bit value will be on SOUT 150.

Conventional PUF architectures have used 2n elements/components (e.g. first capacitor 125/second capacitor 130) to generate n comparisons. From the n comparisons n bits would be generated. Therefore, it would take 2048 elements components to generate a 1024-bit PUF circuit value that could be used to identify a device housing the PUF circuits. Other schemes to reduce the number of elements have been attempted, but those schemes have sometimes run into the problem of correlated pairs of elements/components. Essentially, when two elements/components are "correlated," a comparison of those two elements/components may not yield a random result (e.g. digital bit value) and therefore, the PUF circuit value may not have sufficient entropy or randomness.

Figure 2:
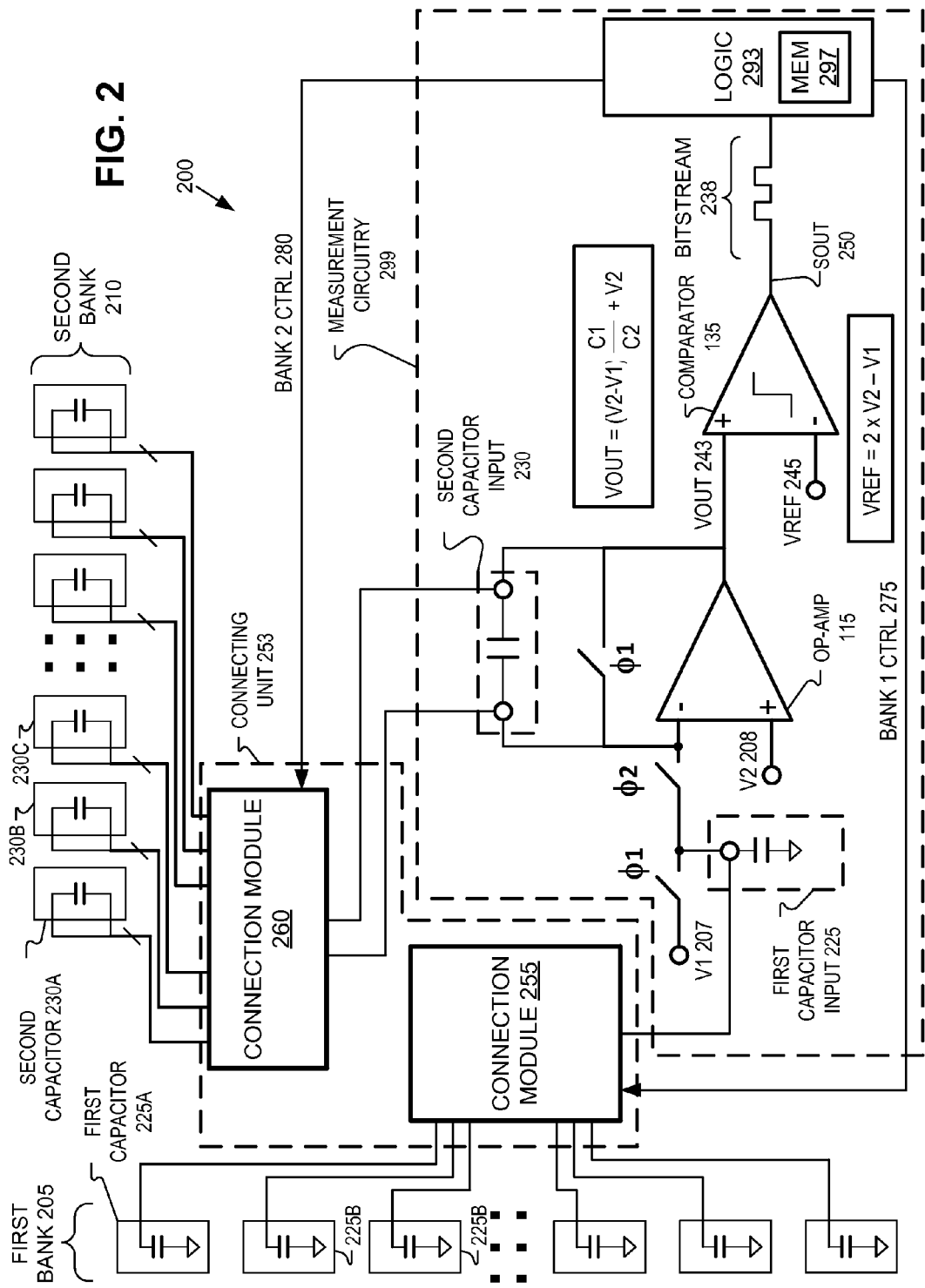
FIG. 2 illustrates an example PUF circuit system that includes a connecting unit coupling a first bank and a second back of capacitors to measurement circuitry, in accordance with an embodiment of the disclosure.

Of course, including a large number (e.g. 2048) of elements/components on a device consumes a fair amount of area. Therefore, it would be advantageous to reduce the number of elements/components on a device required to generate a unique (e.g. 1024-bit) PUF circuit value. FIG. 2 (and later in FIGS. 4-5) illustrates example systems and methods to reduce the number of elements/components on a device required to generate a unique (e.g. 1024-bit) PUF circuit value.

The general disclosed approach illustrated in FIG. 2 (and later in FIGS. 4-5) is to partition identification components such as capacitors (which may be identical) into sets. Then, each identification component in a given set is compared to each identification component from every other set. However, to avoid "correlated" comparisons, the identification components are not compared (or at least their results are not used to generate a PUF circuit value) to identification components in their own set. In other words, there are no intra-set comparisons. The illustrated embodiments only show and describe two sets of identification components. However, those skilled in the art will recognize that this approach is scalable and that any number of sets may be used subject to the constraint that given sets Sp, Sq, and Sr, Sq and Sr cannot be compared if Sp and Sq are compared and Sp and Sr are compared. In that scenario, comparisons of Sq and Sr may lead to correlated comparisons. Assuming that each set has the same cardinality c and there are m+1 sets of elements, $mc^2$ comparisons may be made using this approach, generating $mc^2$ bits for a PUF circuit value. Partitioning n total identification components into two sets, allows $(n/2)^2$ comparisons and a $(n/2)^2$ bit PUF circuit value. Therefore, to generate a 1024-bit PUF circuit value may only require 64 identification components, rather than 2048.

The above PUF architecture approach applies to PUF structures that include comparisons of "identical" circuits to generate output data. However, other PUFs do not require comparisons to generate output bits. For example, butterfly PUFs generate one bit from each butterfly, and do not require comparisons between butterflies. The disclosed approach is also applicable to PUF circuits that do not require comparisons. For example, the butterfly PUFs can be partitioned into two sets and a comparison may be formed by calculating a function of two bits, one from each set. Ideally, this function should be defined to have a balanced output, so that half of the time its output is a '1' and the other half of the time its output is a '0.' Of course, functions of more than two bits can be used and the butterflies can be partitioned into more than two sets. Hence, the disclosed approach can be applied to any PUF structures since comparisons may be made to the output bits of PUF structures.

FIG. 2 illustrates an example PUF circuit system 200 that shows one implementation of the disclosed approach that utilizes PUF circuit 100, in accordance with an embodiment of the disclosure. PUF circuit system 200 includes two banks of capacitors (first bank 205 and second bank 210), a comparator 135, and a connecting unit 253 to couple the two banks of capacitors to comparator 135. First bank 205 includes capacitors 225A, 225B, 225C . . . 225z, where z is the alpha-numeric symbol for the number of capacitors in first bank 205. In one embodiment, first bank 205 includes thirty-two capacitors. Second bank 210 includes capacitors 230A, 230B, 230C . . . 230z, where z is the alpha-numeric symbol for the number of capacitors in second bank 210. In one embodiment, second bank 210 includes thirty-two capacitors. In the illustrated embodiment, each capacitor 230 in second bank 210 is coupled to connection module 260 with a 2-line bus, although other configurations are possible. Each of the capacitors in banks 205 and 210 may be "seemingly identical," meaning that they were designed to be identical circuits, but they are not exactly identical due to random manufacturing variances inherent to the manufacturing of integrated circuits. In one embodiment, the capacitors in bank 205 and 210 are designed to be 28 pF. In one embodiment, the capacitors are metal-insulator-metal capacitors ("MIM").

In the illustrated embodiment, connecting unit 253 includes connection module 255 and connection module 260. Connecting unit 253 connects the two banks of capacitors to measurement circuit 299. It is appreciated that measurement circuitry 299 includes an integrating circuit, as described in connection with FIG. 1. In FIG. 2, connection module 255 couples capacitors from first bank 205 to first capacitor input 225 (the place in FIG. 1 where capacitor 125 was connected to the integrating circuit). Similarly, connection module 260 couples capacitors from second bank 210 to second capacitor input 230 (the place in FIG. 1 where capacitor 130 was connected to the integrating circuit).

In the illustrated embodiment, logic circuitry 293 is coupled to connection module 255 (via Bank 1 CTRL 275) to individually select which capacitor in first bank 205 to couple to first capacitor input 225. Logic circuitry 293 is also coupled to connection module 260 (via. Bank 2 CTRL 280) to individually select which capacitor in second bank 210 to couple to second capacitor input 230. It is appreciated that although the illustrated embodiment shows two control lines (Bank 1 CTRL 275 and Bank 2 CTRL 280) controlling connecting unit 253, other embodiments may include only one control line controlling connecting unit 253. Logic 293 may be configured to control Bank 1 CTRL 275 and Bank 2 CTRL 280 to compare each of the capacitors in first bank 205 to each of the capacitors in second bank 210. In the illustrated embodiment, connecting unit 253 is not coupled to make intra-bank comparisons. In other words, connecting unit 253 is not coupled to make comparisons between capacitors in the same bank, such as comparing capacitors 225A and 225B. This configuration may eliminate "correlated" comparisons.

As logic circuitry 293 controls the comparisons of each of the capacitors in first bank 205 to each of the capacitors in second bank 210, a voltage is generated on VOUT 243 that represent a difference between the capacitor coupled to first capacitor input 225 and the capacitor coupled to second capacitor input 230. VOUT 243 is then compared to VREF 245, as described in connection with FIG. 1. A digital bit value (e.g. 1 or 0) is generated at SOUT 250. Bitstream 238 includes the collection of digital bit values generated from each comparison. Logic circuitry 293 may receive bitstream 238 and construct a PUF circuit value based on bitstream 238. In the illustrated embodiment, logic circuitry 293 includes a memory 297. Logic circuitry 293 may store the PUF circuit value in memory 297.

Figure 3A:
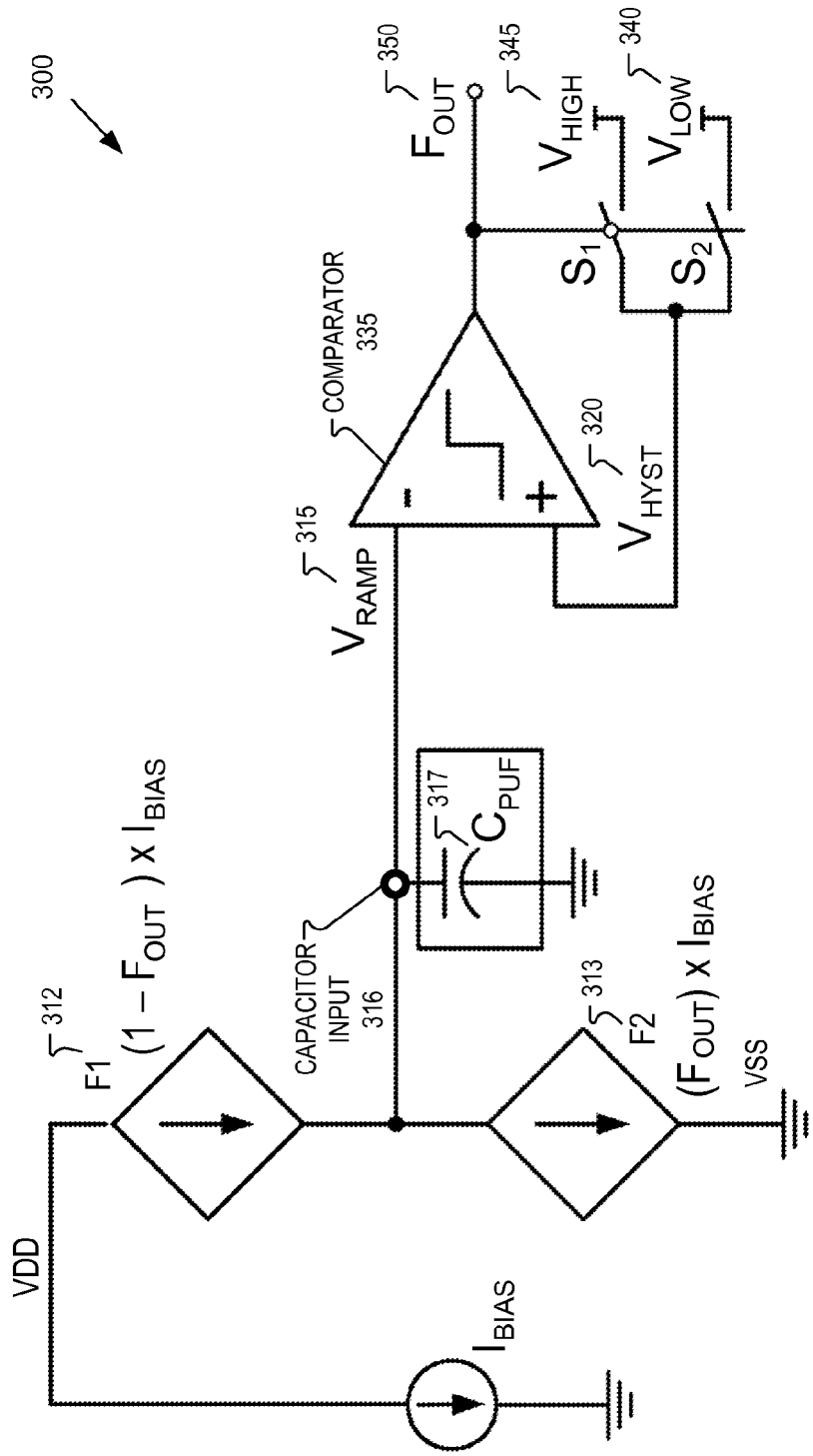
FIG. 3A illustrates an example PUF circuit including a capacitor coupled to an integrating oscillator, in accordance with an embodiment of the disclosure.

FIG. 3A illustrates an example PUF circuit 300, in accordance with an embodiment of the disclosure. PUF circuit 300 includes a capacitor 317 that acts as a charge integrating element coupled to an integrating oscillator. Capacitor 317 is coupled to dependent current source (F1) 312 and dependent current source (F2) 313. F1 312 is coupled to supply voltage VDD and F2 313 is coupled to a circuit ground VSS. A current ($I_{BIAS}$) is drawn from supply voltage VDD. Capacitor 317 is coupled to the inverting input of comparator 335 at a capacitor input 316. $V_{RAMP}$ 315 is the voltage on capacitor input 316. $V_{HYST}$ 320 is the voltage on the non-inverting input of comparator 335. The non-inverting input of comparator 335 is coupled to a first switch (S1) coupled to connect to $V_{HIGH}$ 345 and coupled to a second switch (S2) coupled to connect to $V_{LOW}$ 340. S1 and S2 are coupled to be controlled by $F_{OUT}$ 350, the output of comparator 335. Dependent current source F1 312 delivers current defined by $(1-F_{OUT} 350)*I_{BIAS}$, as illustrated. Dependent current source F2 313 delivers current defined by $F_{OUT} 350*I_{BIAS}$, as illustrated.

Figure 3B:
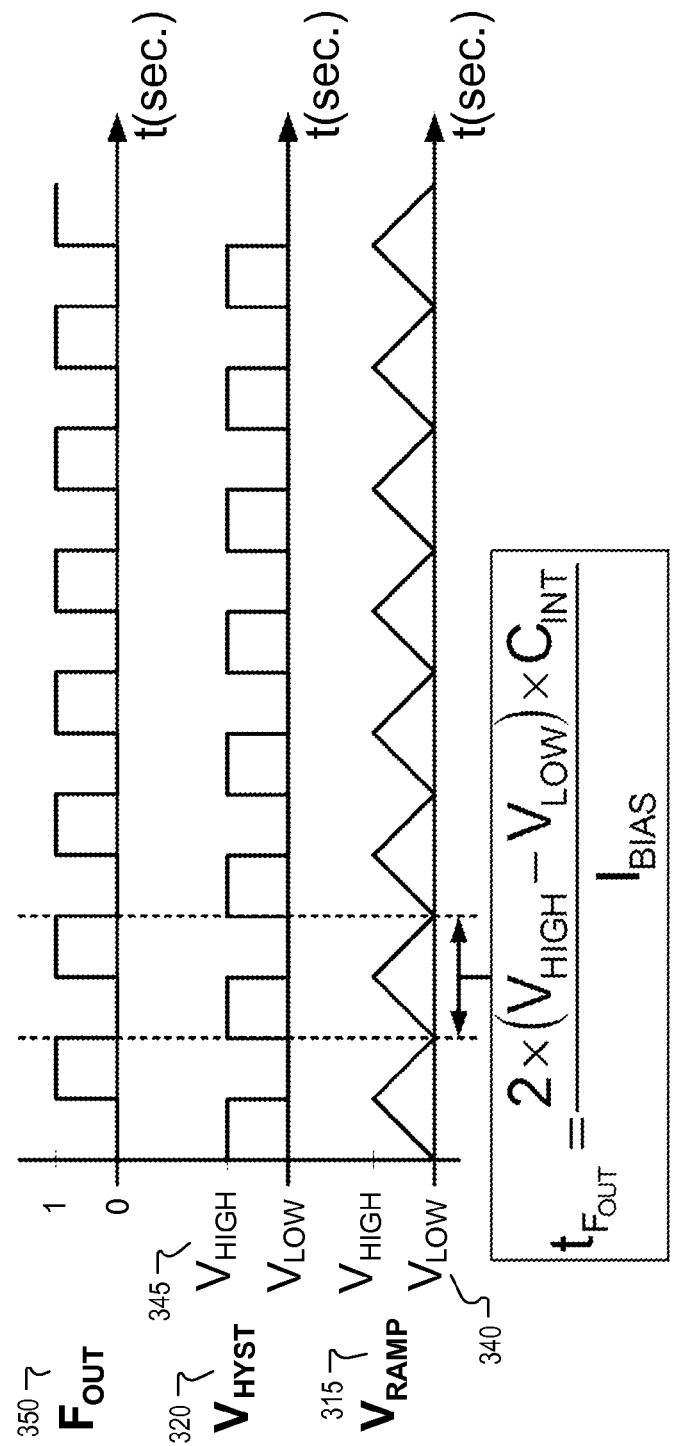
FIG. 3B illustrates an example timing diagram that corresponds with the example PUF circuit illustrated in FIG. 3A, in accordance with an embodiment of the disclosure.

FIG. 3B illustrates an example timing diagram that corresponds with the example PUF circuit illustrated in FIG. 3A, in accordance with an embodiment of the disclosure. FIG. 3B illustrates the oscillation timing for $F_{OUT}$ 350, $V_{HYST}$ 320, and $V_{RAMP}$ 315. When $F_{OUT}$ 350 is HIGH (digital value of 1), $V_{HYST}$ 320 is driven to $V_{LOW}$ 340, as $F_{OUT}$ 350 drives switch S2 to close. When $F_{OUT}$ 350 is LOW (digital value of 0), $V_{HYST}$ 320 is driven to $V_{HIGH}$ 345, as $F_{OUT}$ 350 drives switch S1 to close. $V_{RAMP}$ 315 rises when $F_{OUT}$ 350 is LOW and $V_{HYST}$ 320 is at $V_{HIGH}$ 345, as current charges capacitor 317. $V_{RAMP}$ 315 falls when $F_{OUT}$ 350 is HIGH and $V_{HYST}$ 320 is at $V_{LOW}$ 340, as capacitor 317 discharges. The time for one oscillation of $F_{OUT}$ 350 is given by:

$[2*(V_{HIGH}-V_{LOW})*C_{INT}]/I_{BIAS}$, where $C_{INT}$ is the integrating capacitor, capacitor 317.

If the expected oscillation frequency given by the input parameters (e.g. $V_{HIGH}$, $V_{LOW}$, $C_{INT}$, $I_{BIAS}$) is 25 MHz., the expected oscillation counts after 1 ms integration time would be 25,000 counts. However, between two different capacitors, there may be more or less than the calculated 25,000 counts due to manufacturing differences in the capacitors. Therefore, capacitors can be compared by counting the counts of an integrating oscillator when a given capacitor is coupled to the integrating oscillator.

Figure 4:
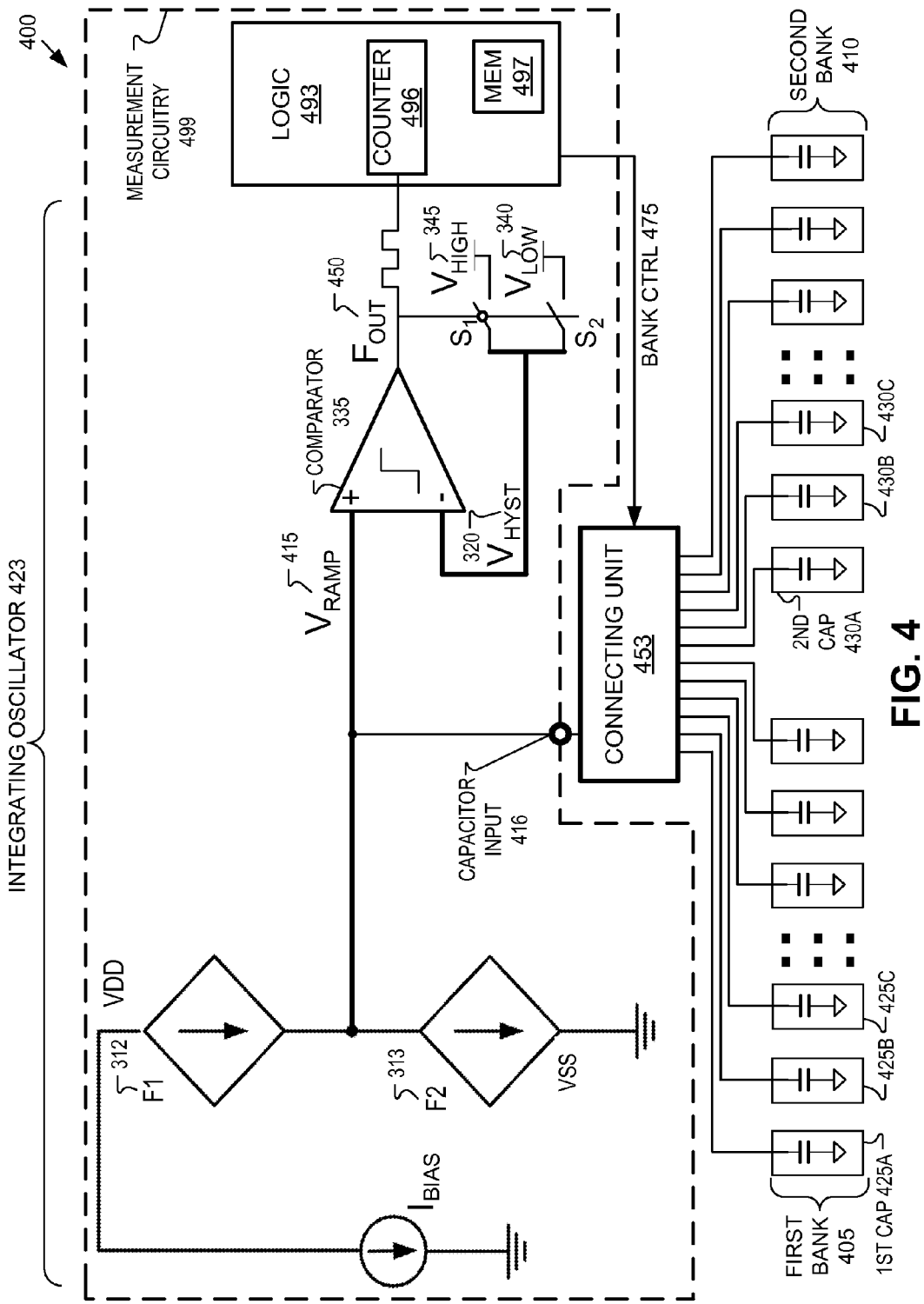
FIG. 4 illustrates an example PUF circuit system that includes a connecting unit coupling a first bank and a second bank of capacitors to measurement circuitry that includes an integrating oscillator, in accordance with an embodiment of the disclosure.

FIG. 4 illustrates an example PUF circuit system 400 that shows one implementation of the disclosed approach that utilizes PUF circuit 300, in accordance with an embodiment of the disclosure. PUF circuit system 400 includes two banks of capacitors (first bank 405 and second bank 410), a connecting unit 453, and measurement circuitry 499. Measurement circuitry 499 includes integrating oscillator 423 that is similar to the integrating oscillator described in connection with FIGS. 3A and 3B.

Connecting unit 453 is coupled between capacitor input 416 and two banks of capacitors. First bank 405 includes capacitors 425A, 425B, 425C . . . 425z, where z is the alpha-numeric symbol for the number of capacitors in first bank 405. In one embodiment, first bank 405 includes thirty-two capacitors. Second bank 410 includes capacitors 430A, 430B, 430C . . . 430z, where z is the alpha-numeric symbol for the number of capacitors in second bank 410. In one embodiment, second bank 410 includes thirty-two capacitors. Each of the capacitors in banks 405 and 410 may be "seemingly identical," meaning that they were designed to be identical circuits, but they are not exactly identical due to random manufacturing variances inherent to the manufacturing of integrated circuits. In one embodiment, the capacitors in bank 405 and 410 are designed to be 28 pF. In one embodiment, the capacitors are metal-insulator-metal capacitors ("MIM").

In the illustrated embodiment, logic circuitry 493 is coupled to connecting unit 453 (via Bank CTRL 475) to individually select which capacitor in first bank 405 or second bank 410 to couple to capacitor input 416. Logic circuitry 493 includes counter 496 and memory 497. When logic circuitry 493 selects a capacitor from first bank 405 or second bank 410 to couple to capacitor input 416, counter 496 counts the oscillations for the selected capacitor, over a given integration time period. The oscillation count over the given integration time period is then stored in memory 497. As logic circuitry 493 toggles through each capacitor in first bank 405 and second bank 410, an oscillation count for each capacitor in first bank 405 and second bank 410 is stored in memory 497. In one embodiment, an oscillation count for each capacitor is counted over an integration period of 1 ms. It is appreciated that longer integration periods may yield more accurate oscillation counts, which may further distinguish capacitors from each other.

Logic circuitry 493 may be configured to compare each of the capacitors in first bank 405 to each of the capacitors in second bank 410. To make the comparisons, logic circuitry 493 may retrieve the oscillation counts for each capacitor from memory 497. When comparing the oscillation counts of two capacitors, logic circuitry may then generate a digital bit value to represent the comparison. The digital bit values from comparing the oscillation counts of the capacitors may collectively be used to generate a PUF circuit value. Logic circuitry 493 may not make intra-bank comparisons. In other words, logic circuitry 493 is not configured to make comparisons between capacitors in the same bank, such as comparing capacitors 425A and 425B. This configuration may eliminate "correlated" comparisons.

Figure 5:
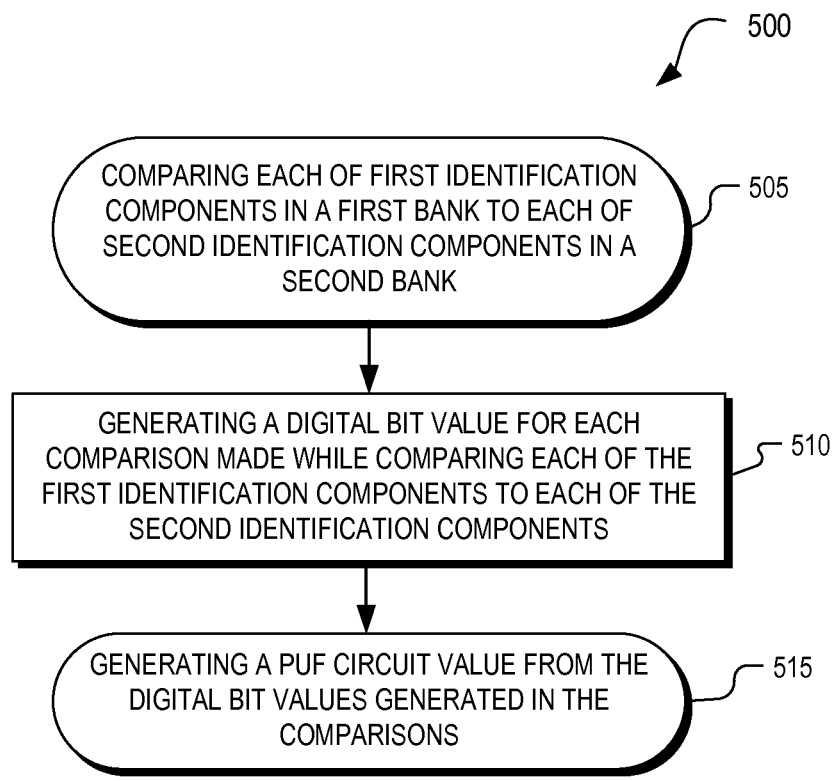
FIG. 5 is a flow chart illustrating a method of generating a PUF circuit value, in accordance with an embodiment of the disclosure.

FIG. 5 is a flow chart illustrating a method of generating a PUF circuit value, in accordance with an embodiment of the disclosure. The order in which some or all of the process blocks appear in process 500 should not be deemed limiting. Rather, one of ordinary skill in the art having the benefit of the present disclosure will understand that some of the process blocks may be executed in a variety of orders not illustrated, or even in parallel.

Process 500 includes process blocks 505, 510, and 515. In process block 505, each of first identification components (e.g. capacitors) in a first bank (e.g. first bank 205 or 405) are compared to each of second identification components (e.g. capacitors) in a second bank (e.g. second bank 210 or 410). In one embodiment of process 500, a given first identification component in the first bank may not be compared to another first identification component in the first bank and a given second identification component in the second bank may not be compared to another second identification component in the second bank. This may eliminate "correlated" comparisons.

In process block 510, a digital bit value for each comparison made while comparing each of the first identification components to each of the second identification components is generated. The comparisons may be made using logic circuitry 293 or 493 controlling connecting unit 253 or 453.

A PUF circuit value from the digital bit values (from each of the comparisons) is generated, in process block 515. In FIG. 2, the digital bit values may be included in bitstream 238. In FIG. 4, logic circuitry 493 may compare oscillation count values associated with different identification components and then generate a digital bit value for each comparison of specific oscillation count values. In one embodiment of process 500, the first bank includes thirty-two identification components and the second bank includes thirty-two identification components, giving 64 total identification components. Then, comparing each of the first identification components (or an oscillation count value associated with first identification components) in the first bank to each of the second identification components (or an oscillation count value associated with second identification components) in the second bank generates 1024 digital bit values. In the embodiment illustrated in FIG. 2, bitstream 238 may include the 1024 digital bit values, which may be received by logic circuitry (e.g. logic circuitry 293). When logic circuitry 293 receives bitstream 238, it generates a 1024-bit PUF circuit value and may store it in memory, such as memory 297. Of course, the number of identification components in the first bank and the second bank may be a number other than thirty-two. Where n components is a sum of the identification components in the first and second bank, $(n/2)^2$ comparisons may be made and $(n/2)^2$ digital bit values may be generated, which may generate a PUF circuit value with $(n/2)^2$ bits.

Figure 6:
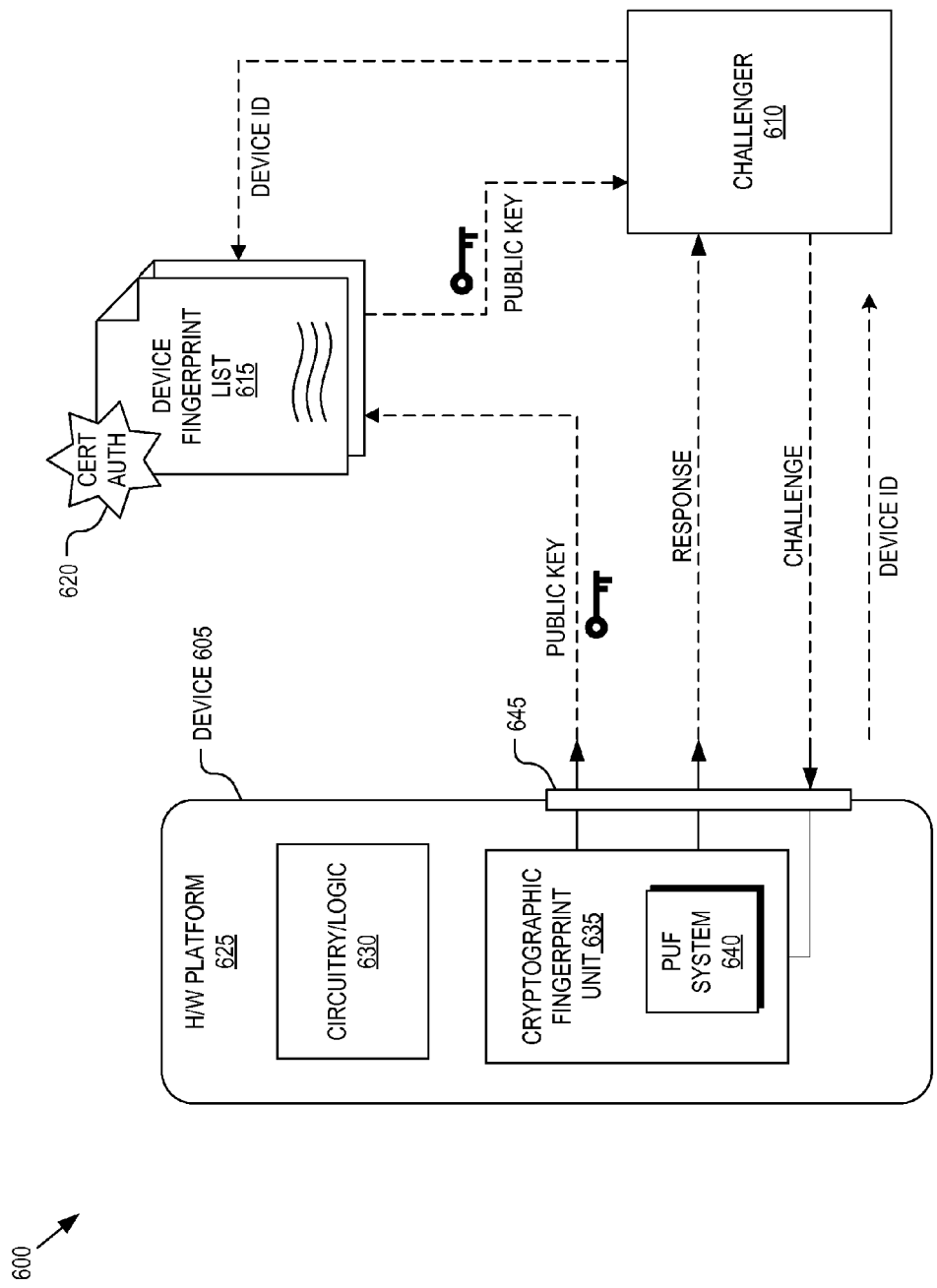
FIG. 6 is a functional block diagram illustrating a device fingerprinting infrastructure for authenticating hardware devices and deterring device subversion by substitution, in accordance with an embodiment of the disclosure.
Figure 7:
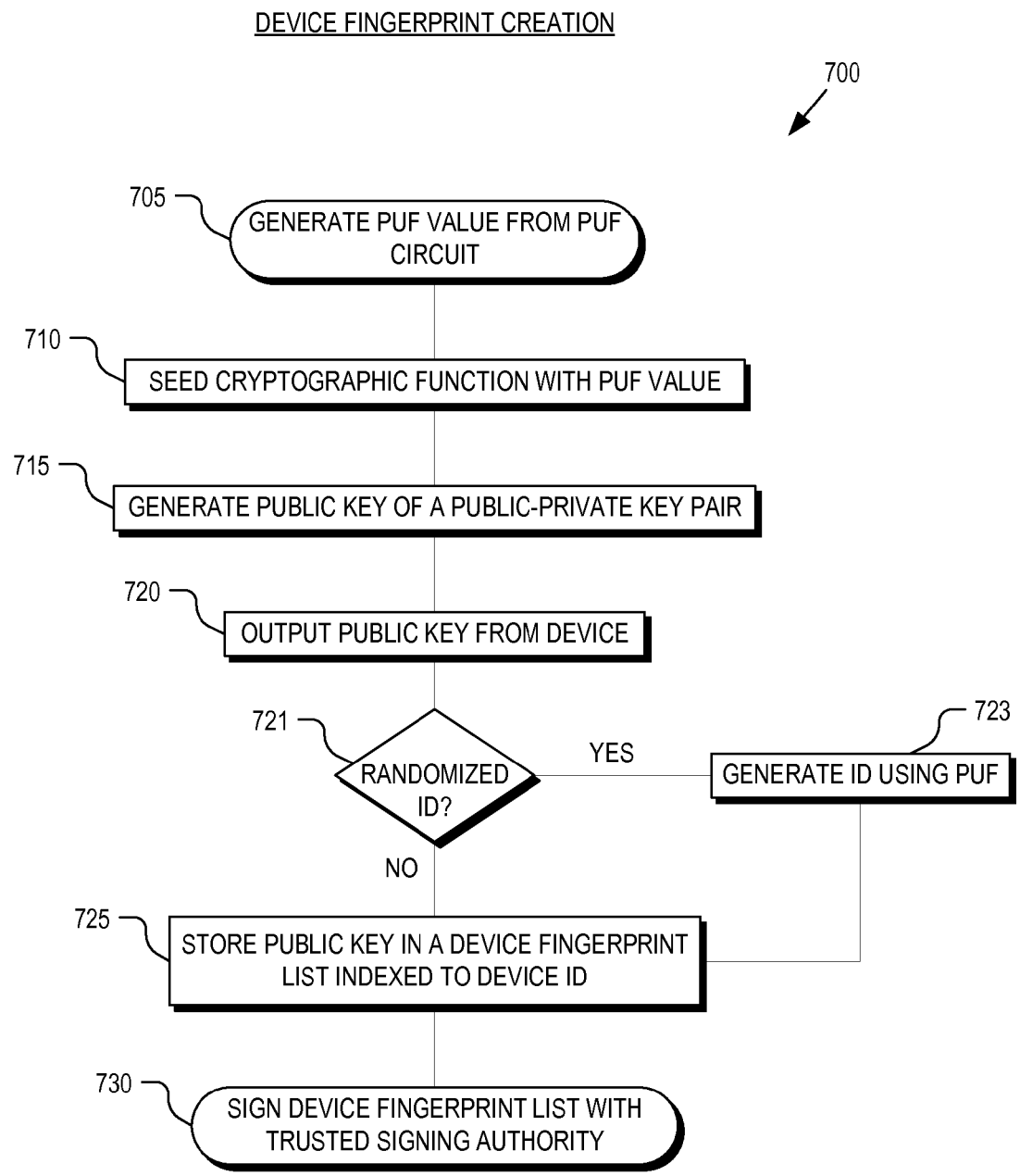
FIG. 7 is a flow chart illustrating a process for uniquely fingerprinting a hardware device, in accordance with an embodiment of the disclosure.
Figure 8:
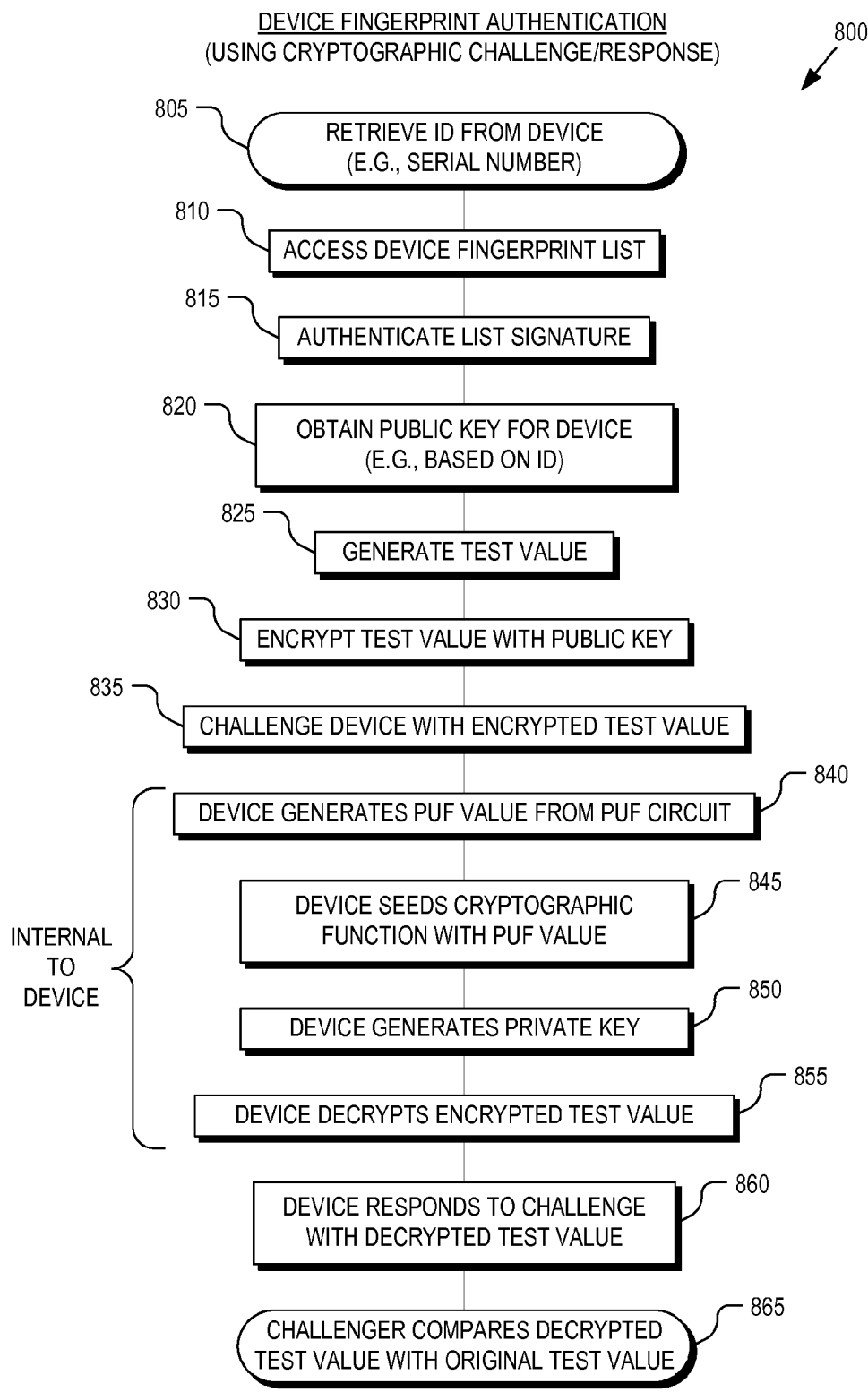
FIG. 8 is a flow chart illustrating a process for authenticating a hardware device using a cryptographic challenge/response and device fingerprint, in accordance with an embodiment of the disclosure.

FIGS. 6-8 describe methods and hardware for authenticating hardware devices that have generated a PUF circuit value. FIG. 6 is a functional block diagram illustrating a device fingerprinting infrastructure 600 for authenticating hardware devices and deterring device subversion by substitution, in accordance with an embodiment of the invention. The illustrated embodiment of infrastructure 600 includes a device 605 to be authenticated, a challenger 610 interested in authenticating device 605 and a device fingerprint list 615 maintained or certified by a certifying authority 620. The illustrated embodiment of device 605 includes a hardware platform 625, primary circuitry (or function logic) 630 of the device, a cryptographic fingerprint unit 635 including a PUF circuit system 640, and an input/output ("I/O") ports 645. Cryptographic fingerprint unit 635 may be implemented entirely within hardware or partially using hardware and partially using software/firmware. In either embodiment, PUF circuit system 640 may be implemented as PUF circuit system 200 or 400. For example, if device 605 is a semiconductor based integrated circuit ("IC"), then PUF circuit system 640 may be integrated into the semiconductor die including circuitry 630. Of course, other components of cryptographic fingerprint unit 635 (described below in connection with FIG. 8) may also be integrated into hardware platform 625 of device 605.

Device 605 may represent any device of which hardware authentication during the deployment phase of its lifecycle is desired. For example, device 605 may represent a CPU, a microcontroller, video card, or virtually any hardware device, which may or may not include software/firmware code. Hardware platform 625 may include a semiconductor die of an application specific IC ("ASIC") or general purpose IC (e.g., CPU), a field programmable gate array ("FPGA"), a printed circuit board ("PCB"), or otherwise. It should be appreciated that hardware platform 625 may include memory units for storing executable code (e.g., software or firmware) for operating primary circuitry 630 and/or portions of cryptographic fingerprint unit 635.

External communication with cryptographic fingerprint unit 635 is conducted through I/O ports 645. In one embodiment, I/O ports 645 may include existing industry standard test ports, such as a Joint Test Action Group ("JTAG") test access port ("TAP"). Of course, external communications may be multiplexed over standard data ports or other types of test ports.

Operation of infrastructure 600 is described in connection with processes 700 and 800 illustrated in the flow charts of FIGS. 7 and 8, respectively. FIG. 7 is a flow chart illustrating process 700 for the creation of a unique cryptographic hardware fingerprint for device 605, in accordance with an embodiment of the invention. The order in which some or all of the process blocks appear in process 700 should not be deemed limiting. Rather, one of ordinary skill in the art having the benefit of the present disclosure will understand that some of the process blocks may be executed in a variety of orders not illustrated.

In a process block 705, PUF circuit system 640 generates a unique PUF circuit value that is measured by cryptographic fingerprint unit 635. The PUF circuit value remains internal to device 605 and is not transmitted externally. In one embodiment, the PUF circuit value is generated in real-time each time it is needed and is not stored for future use internally. The PUF circuit value is a n-bit value (e.g., n=1024 bits) that may be generated via a corresponding PUF circuit system 200 or 400, generated in response to 'n' input test vectors that reconfigure a single PUF circuit to generate the n-bit value, or some combination of both.

In a process block 710, the PUF circuit value is used as a seed value to a cryptographic function. For example, the cryptographic function may be the creation of a public-private key pair where the PUF circuit value is the seed value for the key generator. In one embodiment, the public-private key pair is generated according to the RSA cryptographic algorithm using a seed value generated from the measured PUF circuit value.

In a process block 720, the public key from the public-private key pair is output from device 605 via I/O ports 645. If a standard unique identifier ("ID") is to be used (decision block 721), then process 700 continues to a process block 725. In process block 725, the public key is stored into a device fingerprint list 615 and indexed to ID referencing device 605. In this context, the combination of the public key and ID operate as a sort of cryptographic hardware fingerprint that is uniquely associated with the particular hardware instance of device 605. In one embodiment, the ID is a manufacturing serial number, a globally unique identifier ("GUID"), or other unique identifier associated with hardware platform 625 of device 605. Device fingerprint list 615 may be populated by a manufacturer of device 605 prior to device 605 being shipped to customers as a means of tracking and authenticating part numbers. Device fingerprint list 615 may subsequently be accessed by a customer, an OEM manufacturer incorporating device 605 into a larger system, an end-user, or a third party interacting with device 605 (either directly or remotely over a network) wishing to authenticate device 605 (discussed in connection with FIG. 8). As an added security measure, device fingerprint list 615 may be signed and maintained by a trusted third party, such as a certification authority 620 of a public key infrastructure (process block 730).

Returning to decision block 721, if the ID is to be randomized for added security, then process 700 continues to a process block 723. In process block 723, cryptographic fingerprint unit 635 generates the ID as a randomized value. In one embodiment, the ID can be generated based on a portion of the PUF circuit value output from PUF circuit system 640.

The above combination of elements and procedures forms a method of tracing the origin of the hardware component, thus forming a deterrent against insertion of a subversion or substitution of a subverted component by an adversary who wishes to avoid attribution upon subsequent discovery of the subversion. In particular, this forms a deterrent to subversions introduced during the manufacturing process, since any such subversions could be attributed to the manufacturer. It does not provide attribution of subversions introduced during the deployed life of the device, but does permit detection of tampering, which is in itself a deterrent.

FIG. 8 is a flow chart illustrating a process 800 for authenticating device 605 during the deployment phase of its lifecycle using a cryptographic challenge/response and a device fingerprint, in accordance with an embodiment of the invention. The order in which some or all of the process blocks appear in process 800 should not be deemed limiting. Rather, one of ordinary skill in the art having the benefit of the present disclosure will understand that some of the process blocks may be executed in a variety of orders not illustrated.

In a process block 805, challenger 610 retrieves the device ID associated with device 605. In one embodiment, the ID is retrieved from device 605 either manually or via an electronic query. For example, the ID may be a serial number physically displayed on the part (e.g., sticker, engraving, printed, etc.) or it may be electronically stored within device 605 (e.g., within non-volatile memory).

In a process block 810, challenger 610 uses the ID to access the associated public key from device fingerprint list 615. In one embodiment, the ID is used to retrieve a signed certificate from certification authority 620, which includes the public key. Upon accessing device fingerprint list 615, the list itself may also be authenticated with reference to its certification signature to ensure the list has not been compromised (process block 815). If the signature is validly authenticated, then challenger 610 can retrieve the public key with assurances that it has not been tampered with (process block 820).

In a process block 825, challenger 610 generates a test value or test message for submission to cryptographic fingerprint unit 635 as a sort of secret phrase challenge. The test value can be a numeric value, an alphanumeric phrase, or otherwise. One embodiment uses a random nonce for the test value that is especially hard for anyone other than the challenger to predict. In a process block 830, challenger 610 encrypts the test value using the private key obtained in process block 820. In a process block 835, the encrypted test value is submitted to cryptographic fingerprint unit 635 as a sort of cryptographic challenge.

If device 605 is the original, non-substituted device, then its PUF circuit 540 will be able to regenerate the PUF circuit value used to seed the key generator that created the original public-private key pair. Thus, the authentic device 805 is the only device that will be able to regenerate the original private key to decrypt the encrypted test value and respond to the challenger with the decrypted test value.

Accordingly, in a process block 840, PUF circuit system 640 is enabled to regenerate the PUF circuit value, which is used by the key generator to generate the private key (process block 850). By recreating the private key at the time of being challenged (as opposed to retrieving a stored copy of the private key created at the time of adding the device fingerprint into device fingerprint list 615), the hardware platform 625 of device 605 is contemporaneously being retested at the time of the challenge.

With the newly recreated private key, cryptographic fingerprint unit 635 decrypts the test value (process block 855) and responds to challenger 610 with the decrypted test value (process block 860). Finally, in a process block 865, challenger 610 compares the test value received in the response from device 605 to the original test value it has selected and encrypted. If the two match, challenger 610 can be confident that the hardware platform 625 of device 605 has not be subverted by substituting parts, since the only device in possession of the private key necessary to decrypt the test value would be the original authentic device 605. It is noteworthy, that at no time is the private key transmitted external to device 605, and furthermore in some embodiments the private key is not stored or retained any longer than required to respond to a given challenge. Each time the device 605 is cryptographically challenged on its authenticity, the private key is regenerated using PUF circuit system 640.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of generating a physically unclonable function ("PUF") circuit value comprising:
   comparing each of first identification components in a first bank to each of second identification components in a second bank, wherein a given first identification component in the first bank is not compared to another first identification component in the first bank, and wherein a given second identification component in the second bank is not compared to another second identification component in the second bank each of the first identification components including a first capacitor and each of the second identification components including a second capacitor;
   generating a digital bit value for each comparison made while comparing each of the first identification components to each of the second identification components; and
   generating a PUF circuit value from the digital bit values generated from each comparison made, wherein comparing each of the first identification components to each of the second identification components includes:
      unbalancing charge on the first capacitor and the second capacitor;
      rebalancing the charge on the first capacitor and the second capacitor, after unbalancing the charge; and
      generating an output voltage representative of a difference between the first capacitor and the second capacitor, wherein generating the digital bit value includes comparing the output voltage to a reference voltage.

2. The method of claim 1, wherein n components is a sum of the first identification components and the second identification components, and wherein comparing each of the first identification components in the first bank to each of the second identification components in the second bank allows $(n/2)^2$ of the comparisons and $(n/2)^2$ of the digital bit values, wherein the digital bit values are uncorrelated.

3. The method of claim 1 further comprising:
   generating a count value for each of the first identification components and each of the second identification components by individually coupling each of the first identification components and each of the second identification components as an integrating element of an oscillator and counting oscillations of the oscillator in a specified integration period,
   wherein comparing each of the first identification components to each of the second identification components includes comparing the count value for each of the first identification components and each of the second identification components.

4. The method of claim 3 further comprising:
   storing the count value for each of the first identification components and each of the second identification components in a memory.

5. The method of claim 1, wherein each of the first identification components and each of the second identification components are a same circuit having random manufacturing variances.

6. A non-transitory machine-accessible storage medium that provides instructions that, when executed by a machine, will cause the machine to perform operations comprising:
   comparing each of first electronic components in a first bank to each of the second electronic components in a second bank, wherein a given first identification component in the first bank is not compared to another first identification component in the first bank, and wherein a given second identification component in the second bank is not compared to another second identification component in the second bank;
   generating a digital bit value for each comparison made while comparing each of the first electronic components to each of the second electronic components; and
   generating a PUF circuit value from the digital bit values generated from each comparison made, wherein n components is a sum of the first identification components and the second identification components, and wherein comparing each of the first identification components in the first bank to each of the second identification components in the second bank allows $(n/2)^2$ of the comparisons and $(n/2)^2$ of the digital bit values, wherein the digital bit values are uncorrelated.

7. The non-transitory machine-accessible storage medium of claim 6, wherein each of the first electronic components consists of a first capacitor and each of the second electronic components consists of a second capacitor.

8. The non-transitory machine-accessible storage medium of claim 7, wherein comparing each of the first electronic components to each of the second electronic components includes:
   unbalancing charge on the first capacitor and the second capacitor;
   rebalancing the charge on the first capacitor and the second capacitor, after unbalancing the charge; and
   generating an output voltage representative of a difference between the first capacitor and the second capacitor, wherein generating the digital bit value includes comparing the output voltage to a reference voltage.

9. The non-transitory machine-accessible storage medium of claim 6, further providing instructions that, when executed by the machine, will cause the machine to perform further operations, comprising:
   generating a count value for each of the first identification components and each of the second identification components by individually coupling each of the first identification components and each of the second identification components as an integrating element of an oscillator and counting oscillations of the oscillator in a specified integration period,
   wherein comparing each of the first identification components to each of the second identification components includes comparing the count value for each of the first identification components and each of the second identification components.

10. The non-transitory machine-accessible storage medium of claim 9, further providing instructions that, when executed by the machine, will cause the machine to perform further operations, comprising:
   storing the count value for each of the first electronic components and each of the second electronic components in a memory.

11. The non-transitory machine-accessible storage medium of claim 6, wherein each of the first electronic components and each of the second electronic components are a same circuit having random manufacturing variances.

12. A physically unclonable function ("PUF") circuit system comprising:
   a first array of first identification components;
   a second array of second identification components;
   a connecting unit coupled between at least one input and the first and second arrays to selectably couple each of the first and second identification components to the at least one input; and
   measurement circuitry coupled to the connecting unit to control which of the first identification components and the second identification components are coupled to the at least one input, wherein the measurement circuitry is coupled to the at least one input and configured to compare first values generated by the first identification components to second values generated by the second identification components and generate a digital bit value for each comparison of the first values to the second values, wherein the measurement circuitry includes logic circuitry coupled to the connecting unit to individually select the first identification components in the first array to couple to the at least one input and to individually select the second identification components in the second array to couple to the at least one input.

13. The PUF circuit system of claim 12, wherein each of the first identification components include a first capacitor and each of the second identification components include a second capacitor.

14. The PUF circuit system of claim 13, wherein the measurement circuitry includes:
   an integrating oscillator coupled to the at least one input, wherein the logic circuitry includes a counter coupled to an oscillation output of the integrating oscillator to count oscillations of the integrating oscillator for a specified time period.

15. The PUF circuit system of claim 12, wherein each of the first identification components and each of the second identification components are a same circuit having random manufacturing variances.

16. The PUF circuit system of claim 12, wherein the measurement circuitry is not configured to generate the digital bit value for intra-array comparisons of first values to first values or second values to second values.

17. The PUF circuit system of claim 12, wherein n components is a sum of the first identification components and the second identification components, and wherein $(n/2)^2$ comparisons are made between the first values and the second values, generating $(n/2)^2$ of the digital bit values.

\* \* \* \* \*